US007011711B2

(12) United States Patent
Shreter et al.

(10) Patent No.: US 7,011,711 B2
(45) Date of Patent: Mar. 14, 2006

(54) CHEMICAL VAPOR DEPOSITION REACTOR

(76) Inventors: Yury Georgievich Shreter, J. Duclos Street, 8/1, app. 13, 194223 St Petersburg (RU); Yury Toomasovich Rebane, Kostromskoi prospect 56, app. 22, 194214 St Petersburg (RU); Ruslan Ivanovich Gorbunov, 19 line 2/2, app. 39, 197029 St Petersburg (RU); Sergey Igorevich Stepanov, Smolnv Prospekt 6, apt 2, 193124 St. Petersburg (RU); Vladislav Evgenievich Bougrov, Kondtratievskii Prospekt 64, building 2, app. 7, 195271 St. Petersburg (RU); Vladimir Nikolaev, Bogatvrskii prospect 8, app. 86, 197348 St. Petersburg (RU); Maxim Nikolaevich Blashenkov, Leni Golikova str. 52-III app. 47, 198255 St. Petersburg (RU); Alexander Nikolaevich Andreev, Solidarnisti prospect 9-2, app. 32, 193312 St. Petersburg (RU); Stephen Sen-Tien Lee, 2Fl., No. 327 Sung Lund Rd., Taipei (TW) 105

( * ) Notice: Subject to any disclaimer, the term of this patent is extended or adjusted under 35 U.S.C. 154(b) by 231 days.

(21) Appl. No.: 10/445,233

(22) Filed: May 23, 2003

(65) Prior Publication Data

US 2004/0129213 A1    Jul. 8, 2004

(30) Foreign Application Priority Data

Jan. 7, 2003    (TW) .............................. 92100278 A

(51) Int. Cl.
*C23C 16/00* (2006.01)
*C23C 16/455* (2006.01)
*C23C 16/452* (2006.01)
*C23C 16/34* (2006.01)

(52) U.S. Cl. ....................................... 118/715; 118/724
(58) Field of Classification Search ............... 118/715, 118/724, 725
See application file for complete search history.

(56) References Cited

U.S. PATENT DOCUMENTS

| 4,574,093 A | | 3/1986 | Cox |
| 4,760,244 A | * | 7/1988 | Hokynar ..................... 219/390 |
| 4,848,273 A | * | 7/1989 | Mori et al. ................. 118/729 |
| 5,146,869 A | * | 9/1992 | Bohannon et al. .......... 118/724 |
| 5,192,370 A | * | 3/1993 | Oda et al. ............... 118/723 R |

(Continued)

FOREIGN PATENT DOCUMENTS

JP          61-251118    * 11/1986

*Primary Examiner*—Jeffrie R. Lund
(74) *Attorney, Agent, or Firm*—Trojan Law Offices

(57) ABSTRACT

A chemical vapor deposition reactor for depositing a thin film on at least a substrate through a reaction between a vertical input reagent gas flow and the at least a substrate is provided, in which a vertical output reagent gas flow is produced after the reaction. The reactor includes a vertical tube, at least a reaction chamber located inside the vertical tube, an input flow baffle located on the at least a reaction chamber, and at least a gas exit installed on the at least a reaction chamber for exhausting the vertical input reagent gas flow and the vertical output reagent gas flow. In addition, the substrate is located at the bottom of the at least a reaction chamber. The provided reactors allow the achievement of more efficient heating process, lower gas consumption and higher growth uniformity than the conventional reactors.

18 Claims, 7 Drawing Sheets

U.S. PATENT DOCUMENTS

| | | | | |
|---|---|---|---|---|
| 5,462,013 | A * | 10/1995 | Punola et al. | 118/719 |
| 5,498,292 | A * | 3/1996 | Ozaki | 118/724 |
| 5,520,742 | A * | 5/1996 | Ohkase | 118/724 |
| 5,578,132 | A * | 11/1996 | Yamaga et al. | 118/724 |
| 5,580,171 | A * | 12/1996 | Lim et al. | 366/336 |
| 5,685,914 | A * | 11/1997 | Hills et al. | 118/723 E |
| 5,980,632 | A | 11/1999 | Lyechika | |
| 6,055,927 | A * | 5/2000 | Shang et al. | 118/723 ME |
| 6,085,689 | A * | 7/2000 | Sandhu et al. | 118/723 IR |
| 6,086,673 | A | 7/2000 | Molnar | |
| 6,144,802 | A * | 11/2000 | Kim | 392/479 |
| 6,176,925 | B1 | 1/2001 | Solomon | |
| 6,177,292 | B1 | 1/2001 | Hong | |
| 6,179,913 | B1 | 1/2001 | Solomon | |
| 6,207,932 | B1 * | 3/2001 | Yoo | 219/444.1 |
| 6,267,840 | B1 * | 7/2001 | Vosen | 156/345.33 |
| 6,328,807 | B1 * | 12/2001 | Boek et al. | 118/724 |
| 6,332,927 | B1 * | 12/2001 | Inokuchi et al. | 118/725 |
| 6,350,666 | B1 | 2/2002 | Kyliouk | |
| 6,352,593 | B1 * | 3/2002 | Brors et al. | 118/724 |
| 6,514,348 | B1 * | 2/2003 | Miyamoto | 118/715 |
| 6,537,418 | B1 * | 3/2003 | Muller et al. | 156/345.34 |
| 6,585,823 | B1 * | 7/2003 | Van Wijck | 117/89 |
| 2001/0018894 | A1 * | 9/2001 | Chang | 118/724 |
| 2002/0155713 | A1 * | 10/2002 | Tsvetkov et al. | 438/689 |
| 2004/0129213 | A1 * | 7/2004 | Shreter et al. | 118/715 |
| 2005/0056222 | A1 * | 3/2005 | Melnik et al. | 118/726 |

\* cited by examiner

CHEMICAL VAPOR DEPOSITION REACTOR

This application claims priority to Application No. 092100278 filed in China on Jan. 7, 2003.

FIELD OF THE INVENTION

This invention relates to a reactor, and more particularly to a chemical vapor deposition reactor.

BACKGROUND OF THE INVENTION

Chemical vapor deposition is a thin film deposition technique about using a method of depositing a solid product onto a chip surface from reactants by a chemical reaction in a reactor. The reactants are usually gas reactants. After decades of developments, the chemical vapor deposition has become the most important and the main deposition method in the semiconductor manufacturing process for depositing a thin film on the semiconductor elements, such as conductors, semiconductors, and dielectric materials.

The key equipment of the facilities for the chemical vapor deposition is the reactor, and a thin film is deposed onto a substrate therein. However, according to the relevant application, scopes, the designs for chemical vapor deposition reactors might be various. A Hydrogen Vapor Phase Epitaxy reactor, HVPE reactor, is one of the popular chemical vapor decomposition reactors.

The conventional HVPE reactors for growing the compound semiconductors of IV and III–V groups of the periodical table and their alloys are well-known in the industry. These reactors can be divided into three main groups according to their geometrical features. The three main groups are respectively HVPE reactors with horizontal geometry of gas flow (HG HVPE reactors), HVPE reactors with vertical geometry of gas flow (VG HVPE reactors), and HVPE reactors with closed shower head (SH HVPE reactors).

Please refer to FIG. 1, which shows a structural diagram of a prior HG HVPE reactor. As shown in FIG. 1, the HG HVPE reactor includes a horizontal tube 11, a horizontal reagent gas flow 12, a substrate 13, and a gas heater 14. A hydride thin film is deposited on the substrate 13 through a reaction of the horizontal reagent gas flow 12 in the HG HVPE reactor. The relevant structures and features of HG HVPE reactors are disclosed in U.S. Pat. Nos. 6,176,925, 6,177,292, 6,179,913 and 6,350,666.

The disadvantages of above-mentioned HG HVPE reactors include: 1. It's difficult to obtain a high efficiency of gas utilization and high growth uniformity of the thin film simultaneously. 2. In order to avoid the temperature gradients inside the horizontal tube 11, a big gas heater 14 with high power consumption is always necessary. 3. Because it is difficult to control the temperature difference between the inside walls of the horizontal tube 11 and the substrate 13, a deposition material is always formed on the inside walls of the HG HVPE reactor. 4. Because of the long thermal relaxation time and the changes of the gas flow rate, a Quantum Well structure, QW structure, is unable grown. 5. It is difficult to control and model the growth processes of the thin film due to the low symmetry of the HG HVPE reactor.

Please refer to FIG. 2, which shows a structural diagram of a prior VG HVPE reactor. As shown in FIG. 2, the VG HVPE reactor includes a vertical tube 21, a vertical reagent gas flow 22, a substrate 23, and a gas heater 24. A hydride thin film is deposited on the substrate 23 through a reaction of the vertical reagent gas flow 22 in the VG HVPE reactor. The relevant structures and features of VG HVPE reactors are disclosed in U.S. Pat. Nos. 5,980,632 and 6,086,673.

The disadvantages of above-mentioned VG HVPE reactors include: 1. The growth uniformity of the thin film is not yet ideal enough. 2. In order to avoid the temperature gradients inside the vertical tube 21, a big gas heater 24 with high power consumption is still necessary. 3. Because it is still difficult to control the temperature difference between the inside walls of the vertical tube 21 and the substrate 23, a deposition material is always formed on the inside walls of the VG HVPE reactor. 4. Because of the long thermal relaxation time and the changes of the gas flow rate, a Quantum Well structure, QW structure, is either unable grown.

Please refer to FIG. 3, which shows a structural diagram of a prior SH HVPE reactor. As shown in FIG. 3, the SH HVPE reactor includes a horizontal tube 31, a vertical reagent gas flow 32, a substrate 33, a gas heater 34, and a shower-type head 35. A hydride thin film is deposited on the substrate 33 through a reaction of the vertical reagent gas flow 32 in the SH HVPE reactor. The SR HVPE reactor further includes a horizontal gas flow 36 as a buffer gas. The relevant structures and features of SH HVPE reactors are disclosed in U.S. Pat. No. 4,574,093.

The disadvantages of above-mentioned SH HVPE reactors include: 1. The shower-type head 35 is a non-technological design, so that the shower-type head 35 is difficultly fabricated. 2. Because it is difficult to control the temperature difference between the inside walls of horizontal tube 31 and the substrate 33, deposition materials are always formed on the inside walls of the SH HVPE reactor and the shower-type head 35.

As above-mentioned, a HVPE reactor with the abilities of high efficiency of gas utilization and high growth uniformity of thin film being able to avoid the erroneous deposition is worthy for the relevant industries.

Because of the technical defects described above, the applicant keeps on carving unflaggingly to develop a "CHEMICAL VAPOR DEPOSITION REACTOR".

SUMMARY OF THE INVENTION

In accordance with one aspect of the present invention, a reactor is provided for depositing a thin film on a substrate through a reaction between an input gas and the substrate. A output gas is produced after the reaction. The reactor includes a vertical tube, at least a reaction chamber located inside the vertical tube, a plurality of baffles staggeredly arranged along the inside walls of the vertical tube, a plurality of heaters connected to the vertical tube for controlling a temperature difference between the substrate and walls of the reactor and improving a distribution of the input gas, a gas exit installed on the at least a reaction chamber for exhausting the reacted gas and an extended diffusion layer formed from a bottom of the reaction chamber to the gas exit. In addition, the substrate is located at the bottom of the at least a reaction chamber.

Preferably, the reactor is a hydride vapor deposition reactor.

Preferably, the gas exit is installed on a side wall of the at least a reaction chamber.

Preferably, the reactor is made of a material selected from a group consisting of steel, quartz, sapphire, and ceramics.

Preferably, the input gas is a mixture of HCl, GaCl, $NH_3$, and Ar gases.

Preferably, the substrate is a sapphire substrate.

Preferably, the thin film is one compound semiconductor selected from a group consisting of IV group and their alloys, III–V groups and their alloys, and GaN.

Preferably, the reacted gas is a mixture of HCl, GaCl, $Cl_2$, $NH_3$, and $H_2$ gases.

Preferably, the extended diffusion layer is used for increasing a utility rate of the input gas and a deposition unity.

Preferably, the plurality of heaters include a first gas heater and a second gas heater.

Preferably, the first gas heater is one of an external side wall gas heater and an internal side wall gas heater.

Preferably, the second gas heater is an external bottom gas heater.

Preferably, the second gas heater includes an input gas tube and a heater.

Preferably, the reaction chamber is a cylindrical chamber.

Preferably, the extended diffusion layer is used for transmitting the input gas to the substrate.

In accordance with another aspect of the present invention, a hydride vapor deposition reactor is provided for depositing a thin film on a substrate through a reaction between an input gas and the substrate. A reacted gas is produced after the reaction. The reactor includes a vertical tube with two side wall gas heaters and a bottom gas heater, a baffle staggeredly located on an inside wall of the vertical tube for extending routes of the input gas, a reaction chamber located inside the vertical tube a second baffle located on a top of the reaction chamber, and a gas exit installed on a side wall of the reaction chamber for exhausting the reacted gas.

Preferably, the thin film is one compound semiconductor selected from a group consisting of III–V groups and their alloys, IV groups and their alloys, and GaN.

Preferably, the two side wall gas heaters are a first gas heater and a second gas heater respectively located on external side walls of the vertical tube.

Preferably, the vertical tube further includes a Ga tank.

The above contents and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention provides HVPE reactors with opposite direction flow geometries and extended diffusion layers. A quantum well structure can be formed on a semiconductor material in the HVPE reactor of the present invention.

Figure 1:
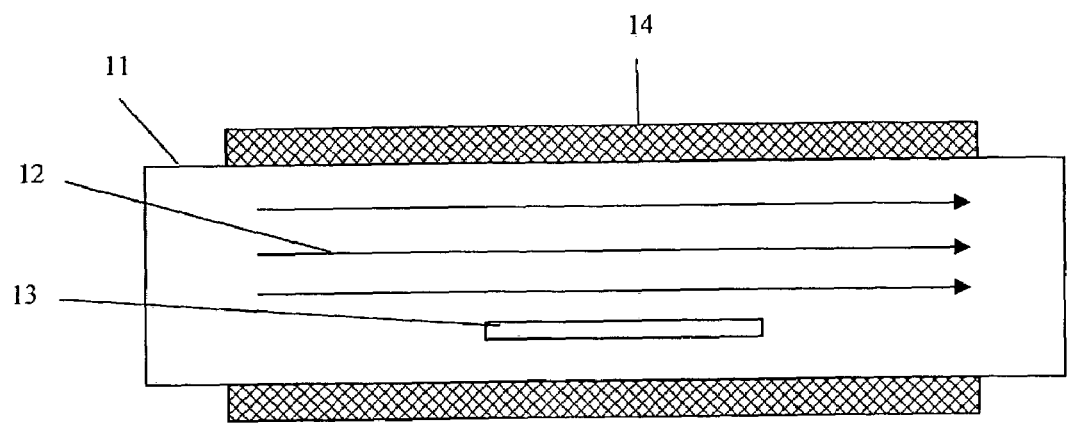
FIG. 1 shows a structural diagram of a prior HG HVPE reactor.
Figure 2:
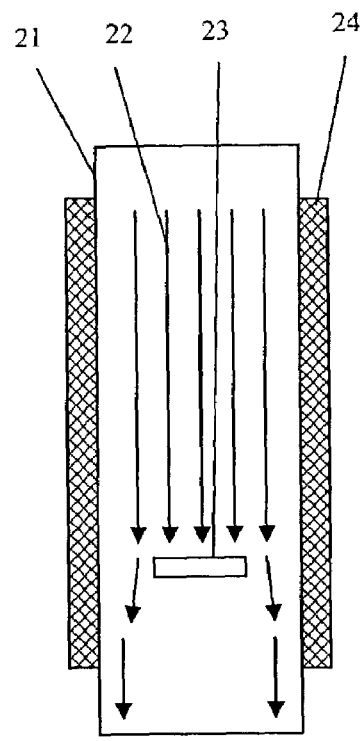
FIG. 2 shows a structural diagram of a prior VG HVPE reactor.
Figure 3:
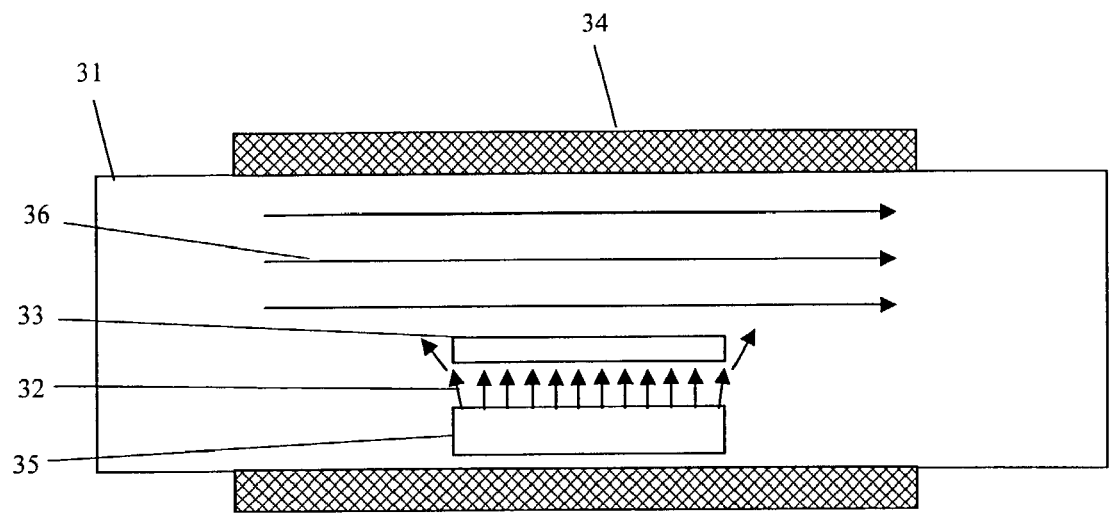
FIG. 3 shows a structural diagram of a prior SH HVPE reactor.
Figure 4:
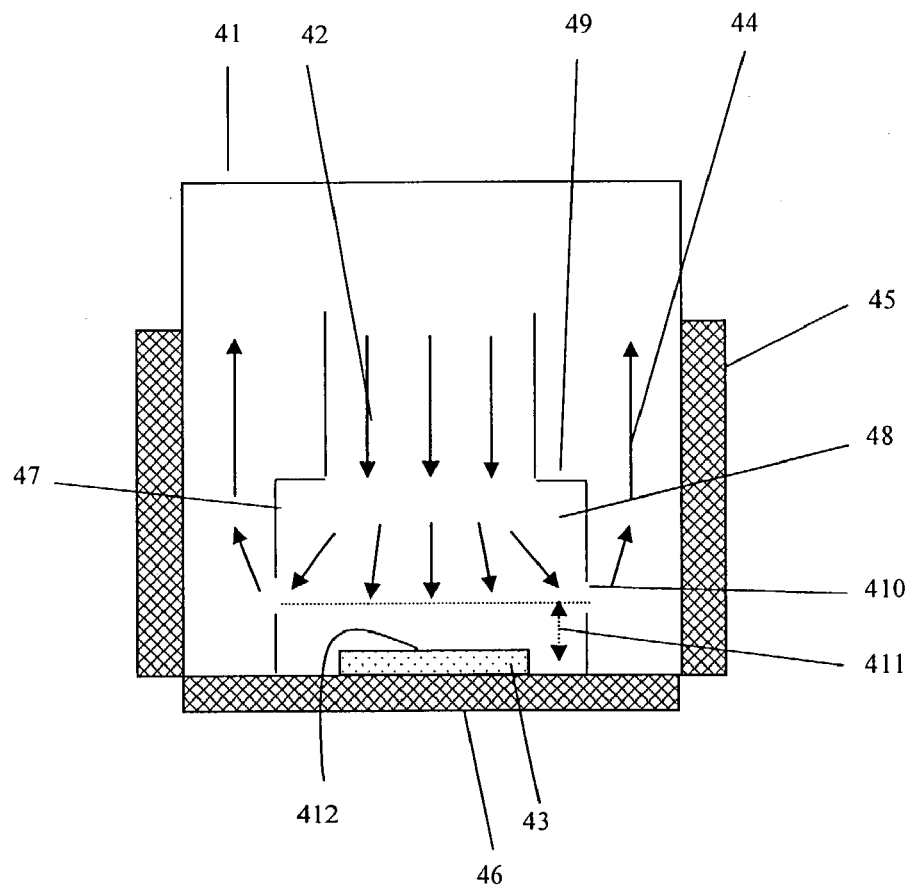
FIG. 4 shows a structural diagram of the HVPE reactor according to a preferred embodiment I of the present invention.

Please refer to FIG. 4, which shows a structural diagram of a HVPE reactor according to the preferred embodiment I of the present invention. As shown in FIG. 4, the HVPE reactor includes a vertical tube 41, a first gas heater 45, a second gas heater 46, a reaction chamber 47, the diaphragm 49, and the gas exist slit 410. The reaction chamber 47 has a containing portion 48. And, a substrate 43 for being deposited thereon is positioned at the lower part of the containing portion 48.

The first gas heater 45 is positioned on the external side wall of the vertical tube 41, and the second gas heater 46 is positioned at the external bottom wall of the vertical tube 41. The reaction chamber 47 is located inside the vertical tube 41 and is a cylindrical reaction chamber. The diaphragm 49 is positioned on the top of the reaction chamber 47, and the gas exist slit 410 is located on the internal side wail of the reaction chamber 47 with a particular distance from the substrate 43. An extended diffusion layer 411 is formed between the gas exist slit 410 and the bottom of the reaction chamber 47. The reaction chamber 47 is made of a material selected from a group consisting of steel, quartz, sapphire, and ceramics. The substrate 43 is a sapphire substrate.

The HVPE reactor of the preferred embodiment I of the present invention is used for depositing the thin film 412 on the substrate 43 by a reaction between the input reagent gas 42 and the substrate 43. And, a reacted gas 44 is produced after the reaction. The reacted gas 44 can be exhausted through the gas exist slit 410.

The input reagent gas 42 is a mixture of HCl, GaCl, $NH_3$, and Ar gases. The thin film 412 is a compound semiconductor selected from a group consisting of III–V groups and their alloys, IV group and their alloys, and GaN. The reacted gas 44 is a mixture of HCl, GaCl, $NH_3$, Ar, and $H_2$ gases. And, the second gas heater 46 is used for controlling the temperature difference between the substrate 43 and the internal side walls of the HVPE reactor.

On the other hand, the substrate 43 is not directly reacted with the input reagent gas 42. The reaction is performed during the diffusion process of the input reagent gas 42 in the extended diffusion layer 411. Meanwhile, the input reagent gas 42 is still in a gas state during the diffusion process. Because the second gas heater 46 can be used to control the temperature difference between the internal side walls of the HVPE reactor and the substrate 43, no deposition will be formed on the internal side walls of the HVPE reactor.

Therefore, the advantages of the reactor according to the preferred embodiment I includes that it is not necessary to seal up the first gas heater 45 and the second gas heater 46, because they are not directly exposed to the input reagent gas 42 and the reacted gas 44. As above, the HVPE reactor of the present invention has a significantly smaller volume than those of the prior reactors.

Figure 5:
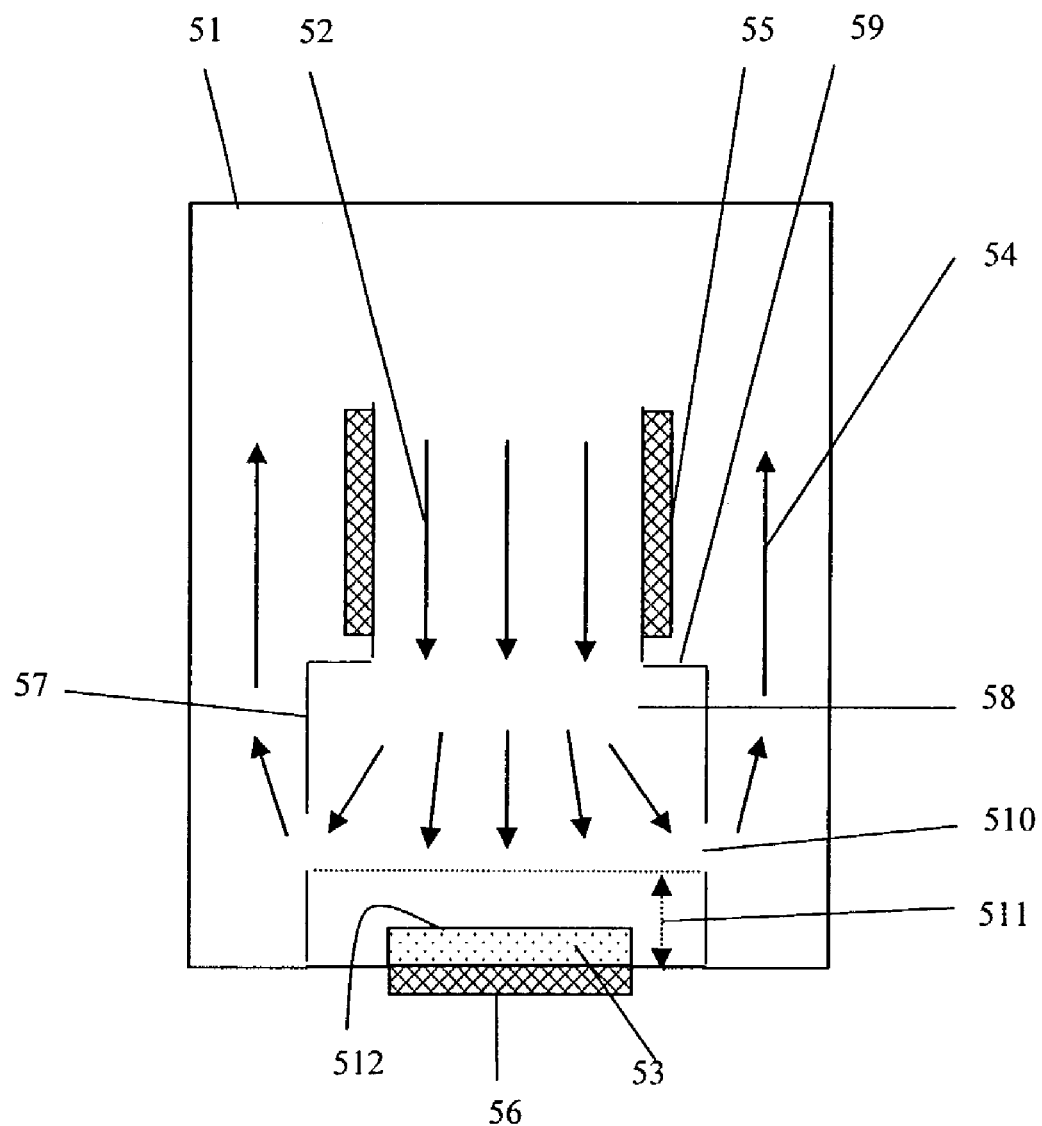
FIG. 5 shows a structural diagram of the HVPE reactor according to a preferred embodiment II of the present invention.

Please refer to FIG. 5, which shows a structural diagram of a HVPE reactor according to the preferred embodiment II of the present invention. As shown in FIG. 5, the HVPE reactor includes a vertical tube 51, a first gas heater 55, a second gas heater 56, a reaction chamber 57, the diaphragm 59, and the gas exist slit 510. The reaction chamber 57 includes a containing portion 58. And, a substrate 53 for being deposited thereon is positioned at the lower part of the containing portion 58.

The first gas heater 55 is positioned in the vertical tube 51. The second gas heater 56 is positioned at the external bottom wall of the vertical tube 51. The reaction chamber 57 is located inside the vertical tube 51 and is a cylindrical reaction chamber. The diaphragm 59 is positioned on the top of the reaction chamber 57, and the gas exist slit 510 is located on the side wall of the reaction chamber 57 with a particular distance from the substrate 53. An extended diffusion layer 511 is formed from the gas exist slit 510 to the bottom of the reaction chamber 57. The reaction chamber 57 is made of a material selected from a group consisting of steel, quartz, sapphire, and ceramics. The substrate 53 is a sapphire substrate.

The HVPE reactor of the preferred embodiment II is used for depositing a thin film 512 on the substrate 53 by a reaction between the input reagent gas 52 and the substrate 53. And, the reacted gas 54 is produced after the reaction. The reacted gas 54 can be exhausted through the gas exist slit 510.

The input reagent gas 52 is a mixture of HCl, GaCl, $NH_3$, and Ar gases. The thin film 512 is a compound semiconductor selected from a group consisting of III–V groups and their alloys, IV group and their alloys, and GaN. The reacted gas 54 is a mixture of HCl, GaCl, $NH_3$, Ar, and $H_2$ gases. And, the second gas heater 56 is used for controlling the temperature difference between the substrate 53 and the side walls of the HVPE reactor.

On the other hand, the substrate 53 is not directly reacted with the input reagent gas 52. The reaction is performed during the diffusion process of the input reagent gas 52 in the extended diffusion layer 511. Meanwhile, the input reagent gas 52 is still in a gas state during the diffusion process. Because the second gas heater 56 can be used to control the temperature difference between the side walls of the HVPE reactor and the substrate 53, no deposition will be formed on the internal side walls of the HVPE reactor.

The first gas heater 55 is directly exposed to the reacted gas 54, so that it is necessary to seal up the first gas heater 55 of the HVPE reactor of the preferred embodiment II of the present invention. Furthermore, the HVPE reactor according to the preferred embodiment II is more sensitive to the temperature change than the HVPE reactor of the preferred embodiment I.

Figure 6:
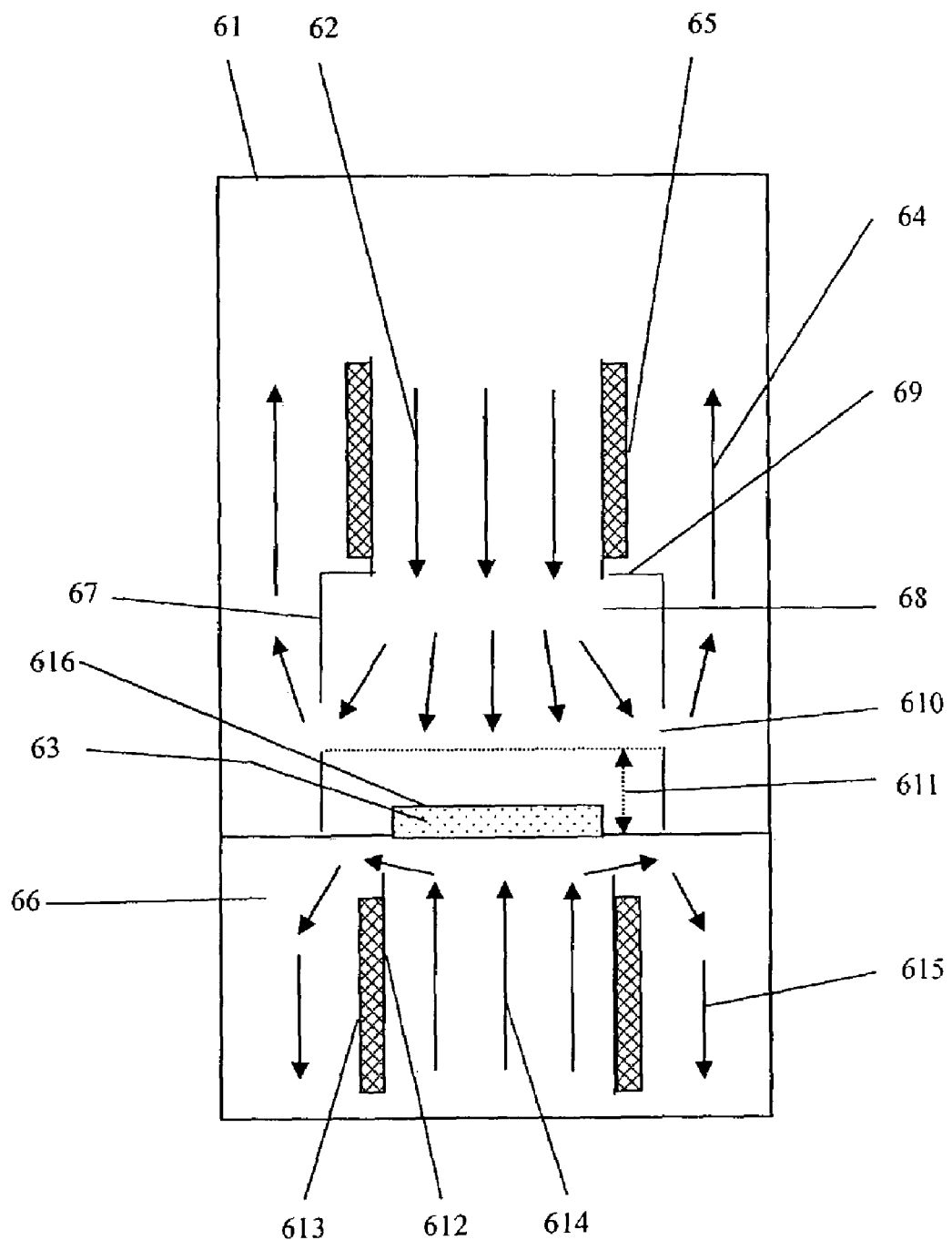
FIG. 6 shows a structural diagram of the HVPE reactor according to a preferred embodiment III of the present invention.

Please refer to FIG. 6, which shows a structural diagram of a HVPE reactor according to the preferred embodiment III of the present invention. As shown in FIG. 6, the HVPE reactor includes a vertical tube 61, a first gas heater 65, a second gas heater 66, a reaction chamber 67, the diaphragm 69, and the gas exist slit 610. The reaction chamber 67 includes a containing portion 68. And, a substrate 63 for being deposited thereon is positioned at the lower part of the containing portion 68.

The first gas heater 65 is positioned on the internal side wall of the vertical tube 61. The second gas heater 66 is positioned at the external bottom wall of the vertical tube 61. The reaction chamber 67 is located inside the vertical tube 61 and is a cylindrical reaction chamber. The diaphragm 69 is positioned on the top of the reaction chamber 67, and the gas exist slit 610 is located on the side wall of the reaction chamber 67 with a particular distance from the substrate 63. An extended diffusion layer 611 is formed from the gas exist slit 610 to the bottom of the reaction chamber 67. The reaction chamber 67 is made of a material selected from a group consisting of steel, quartz, sapphire, and ceramics. The substrate 63 is a sapphire substrate.

Particularly, the second gas heater 66 includes an input gas tube 612 and an internal heater 613. The input reagent gas 614 is heated by the internal heater 613 while being flown through the input gas tube 612. A reacted gas 615 is formed after the heated input reagent gas flow 614 reacts with the substrate 63. The input reagent gas 614 and the reacted gas 615 are oppositely directed and thermally coupled. Because the temperature of the substrate 63 directly depends on the heated input reagent gas 614, the temperature of the substrate 63 can be changed quickly.

In addition, the HVPE reactor of the preferred embodiment III of the present invention is used for depositing a thin film 616 on the substrate 63 by a reaction between the input reagent gas 62 and the substrate 63. A reacted gas 64 is produced after the reaction. The reacted gas flow 64 can be exhausted through the gas exist slit 610.

The input reagent gas 62 is a mixture of HCl, GaCl, $NH_3$, and Ar gases. The thin film 616 is a compound semiconductor selected from a group consisting of III–V groups and their alloys, IV group and their alloys, and GaN. The reacted gas 64 is a mixture of HCl, GaCl, $NH_3$, Ar, and $H_2$ gases.

In the preferred embodiment III, the substrate 63 is not directly reacted with the input reagent gas 62. The reaction is performed during the diffusion process of the input reagent gas 62 in the extended diffusion layer 611. The input reagent gas 62 is still in a gas state during the diffusion process. The second gas heater 66 is used for controlling the temperature difference between the substrate 63 and the side walls of the reactor, so that no deposition will be formed on the internal side walls of the HVPE reactor.

The reactors of the preferred embodiments I, II, and III of the present invention are used for depositing a thin film on single substrate, so that they are not suitable for the mass production. On the other hand, the following reactors of the preferred embodiments IV and V of the present invention are suitable for the mass production of the substrates with thin films.

Figure 7:
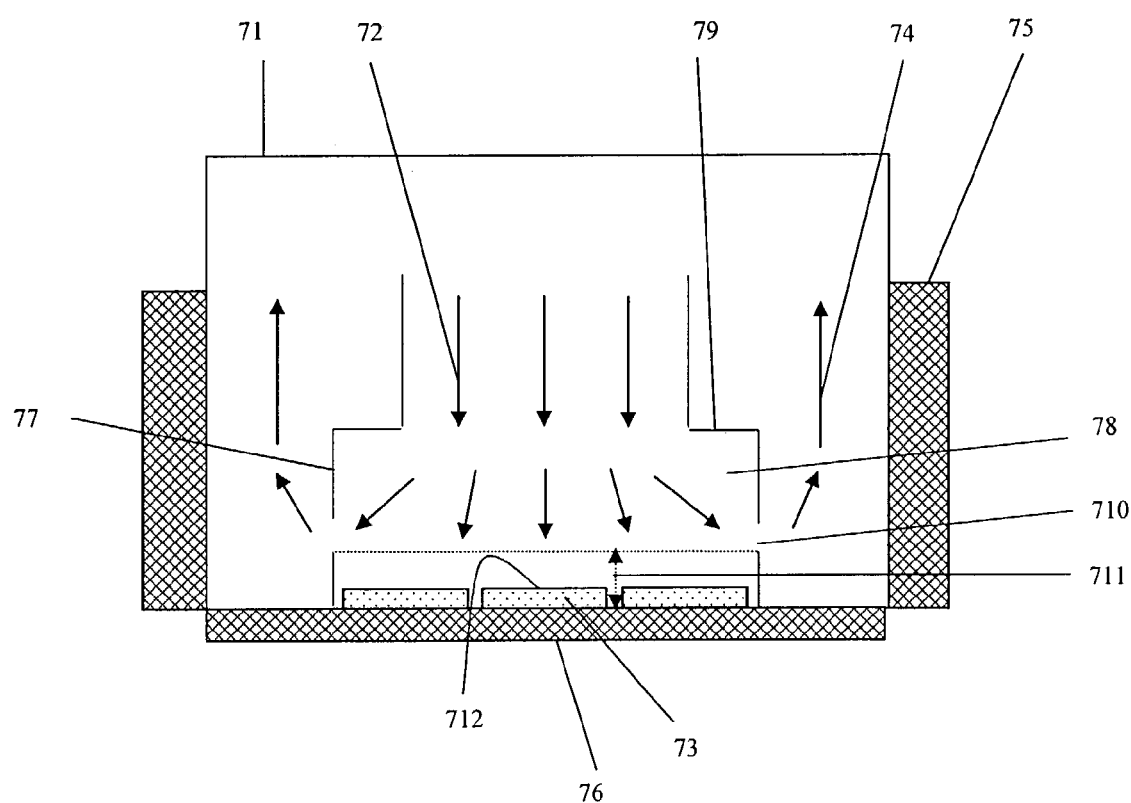
FIG. 7 shows a structural diagram of the HVPE reactor according to a preferred embodiment IV of the present invention.

Please refer to FIG. 7, which shows a structural diagram of a HVPE reactor according to the preferred embodiment IV of the present invention. As shown in FIG. 7, the HVPE reactor includes a vertical tube 71, a first gas heater 75, a second gas heater 76, a reaction chamber 77, the diaphragm 79, and the gas exist slit 710. The reaction chamber 77 includes a containing portion 78. And, the substrates 73 for being deposited thereon are positioned at the lower part of the containing portion 78.

The first gas heater 75 is positioned at the external side wall of the vertical tube 71, and the second gas heater 76 is positioned on the external bottom wall of the vertical tube 71. The reaction chamber 77 is located inside the vertical tube 71 and is a cylindrical reaction chamber. The diaphragm 79 is positioned on the top of the reaction chamber 77, and the gas exist slit 710 is located on the side wall of the reaction chamber 77 with a particular distance from the substrates 73. An extended diffusion layer 711 is formed from the gas exist slit 710 to the bottom of the reaction chamber 77. The reaction chamber 77 is made of a material selected from a group consisting of steel, quartz, sapphire, and ceramics. The substrates 73 are sapphire substrates.

The HVPE reactor of the preferred embodiment IV is used for depositing the thin film 712 on each of the substrates 73 by reactions between the input reagent gas 72 and the substrates 73. A reacted gas 74 is produced after the reaction. The reacted gas 74 can be exhausted through the gas exist slit 710.

The input reagent gas 72 is a mixture of HCl, GaCl, $NH_3$, and Ar gases. The thin film 712 is a compound semiconductor selected from a group consisting of III–V groups and their alloys, IV group and their alloys, and GaN. The reacted gas 74 is a mixture of HCl, GaCl, $NH_3$, Ar, and $H_2$ gases.

In the preferred embodiment IV, the substrates 73 are not directly reacted with the blowing of the input reagent gas 72. The reactions are performed during the diffusion process of the input reagent gas 72 in the extended diffusion layer 711. The input reagent gas 72 is still in a gas state during the diffusion process. The second gas heater 76 is used for controlling the temperature difference between the substrates 73 and the side walls of the HVPE reactor, so that no deposition will be formed on the internal side walls of the HVPE reactor.

Figure 8:
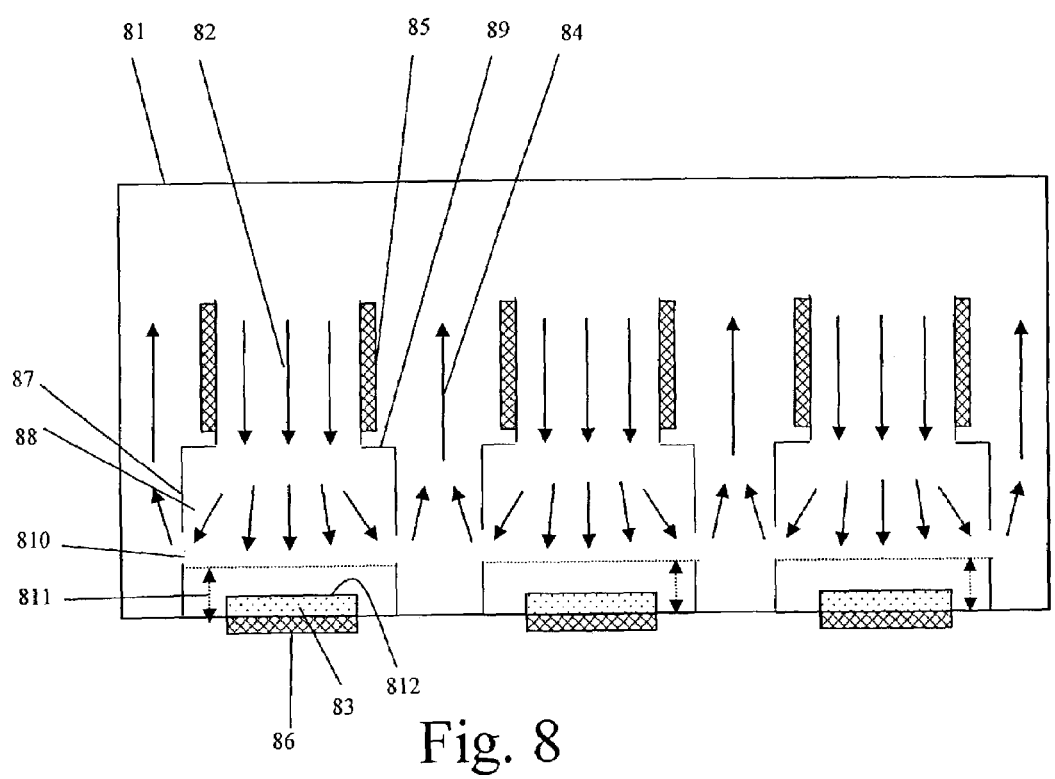
FIG. 8 shows a structural diagram of the HVPE reactor according to a preferred embodiment V of the present invention.

Please refer to FIG. 8, which shows a structural diagram of a HVPE reactor according to the preferred embodiment V of the present invention. As shown in FIG. 8, the HVPE reactor includes a vertical tube 81, a plurality of first gas heaters 85, a plurality of second gas heaters 86, a plurality of reaction chambers 87, the diaphragms 89, and the gas exist slits 810. Each of the reaction chambers 87 includes a containing portion 88. And, each of the substrates 83 for being deposited thereon is positioned at the lower part of each containing portion 88.

The first gas heaters 85 are positioned on the external side walls of the vertical tubes 81 respectively, and the second gas heaters 86 are positioned at the external bottom walls of the vertical tubes 81. The reaction chambers 87 are respectively located inside the vertical tubes 81 and are cylindrical reaction chambers. The diaphragm 89 is positioned on a top of the reaction chamber 87, and each gas exist slit 810 is located on the internal side wall of the reaction chamber 87 with a particular distance from the substrate 83. A plurality of extended diffusion layers 811 are respectively formed from the gas exist slits 810 to the bottoms of the reaction chambers 87. The reaction chambers 87 are made of a material selected from a group consisting of steel, quartz, sapphire, and ceramics. The substrates 83 are sapphire substrates.

The HVPE reactor of the preferred embodiment V of the present invention is used for respectively depositing the thin film 812 on the substrate 83 by a reaction between the input reagent gas 82 and the substrate 83, and, the reacted gas 84 is produced after the reaction. The reacted gas 84 can be exhausted through the gas exist slit 810.

The input reagent gas 82 is a mixture of HCl, GaCl, $NH_3$, and Ar gases. The thin film 812 is a compound semiconductor selected from a group consisting of III–V groups and their alloys, IV group and their alloys, and GaN. The output reagent gas 84 is a mixture of HCl, GaCl, $NH_3$, Ar, and $H_2$ gases.

In the preferred embodiment V, the substrates 83 are not directly reacted with the input reagent gas 82. The reaction is performed during the diffusion process of the input reagent gas 82 in the extended diffusion layers 811. And, the input reagent gas 82 is still in a gas state during the diffusion process. The second gas heater 86 is used for controlling the temperature difference between the substrate 83 and the side walls of the HVPE reactor, so that no deposition will be formed on the internal side walls of the HVPE reactor.

The reactors of the preferred embodiments I, II, III, IV, and V are the main designs of the HVPE reactors in the present invention. The following reactor of the preferred embodiment VI is an extended reactor of the preferred embodiment I.

Figure 9:
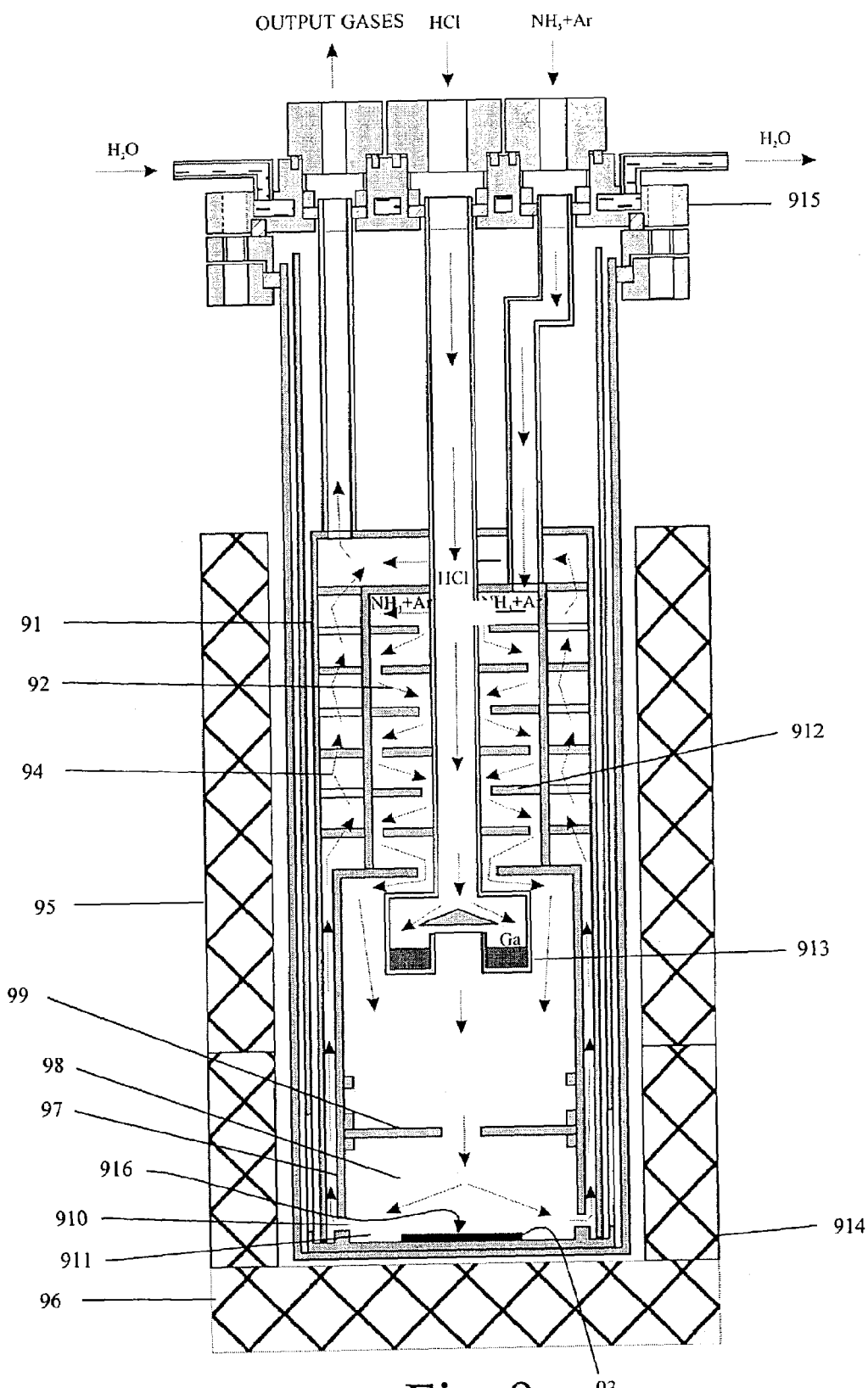
FIG. 9 shows a structural diagram of the HVPE reactor according to a preferred embodiment VI of the present invention.

Please refer to FIG. 9, which shows a structural diagram of a HVPE reactor according to the preferred embodiment VI of the present invention. As shown in FIG. 9, the HVPE reactor includes a vertical tube 91, a first gas heater 95, a second gas heater 914, a third gas heater 96, a reaction chamber 97, the second diaphragm 99, the first diaphragms 912, the gas exist slit 910, the Ga tank 913, and the water cooled flange 915. The reaction chamber 97 includes a containing portion 98. And, the substrate 93 for being deposited thereon is positioned at the lower part of the containing portion 98.

The first gas heater 95 is positioned on one external side wall of the vertical tube 91, the second gas heater 914 is positioned on another external side wall of the vertical tube 91, and the third gas heater 96 is positioned at the external bottom wall of the vertical tube 91. The reaction chamber 97 is located inside the vertical tube 91 and is a cylindrical reaction chamber. The second diaphragm 99 is positioned on the top of the reaction chamber 97 and upon the first diaphragms 912 staggeredly arranged along the side wall of the vertical tube 91. The gas exist slit 910 is located on the internal side wall of the reaction chamber 97 with a particular distance from the substrate 93. An extended diffusion layer 911 is formed from the gas exist slit 910 to the bottom of the reaction chamber 97. The reaction chamber 97 is made of a material selected from a group consisting of steel, quartz, sapphire, and ceramics. The substrate 93 is a sapphire substrate.

The HVPE reactor of the preferred embodiment VI of the present invention is used for depositing the thin film 916 on the substrate 93 by a reaction between the input reagent gas and the substrate 93. The reacted gas 94 is produced after the reaction. The reacted gas 94 can be exhausted through the gas exit slit 910.

The input reagent gas is a mixture of a first gas containing $NH_3$ and Ar gases and a second gas containing HCl and GaCl gases. The thin film 916 is a compound semiconductor selected from a group consisting of III–V groups and their alloys, IV group and their alloys, and GaN. The reacted gas 94 is a mixture of HCl, GaCl, $NH_3$, Ar, and Ha gases. The first diaphragm 912 is for extending the flowing routes of the first gas 92 and the reacted gas 94, and enhancing the thermal interaction between the first gas 92 and the reacted gas 94. Furthermore, it is possible that the volume of the reactor can be effectively reduced by the design of first diaphragms 912.

In the preferred embodiment VI, the substrate 93 is not directly reacted with the input reagent gas. The reaction is performed during the diffusion process of the input reagent gas in the extended diffusion layer 911. The input reagent gas is still in a gas state during the diffusion process. The third gas heater 96 is used for controlling the temperature difference between the substrate 93 and the side walls of the HVPE reactor, so that no deposition will be formed on the internal side walls of the HVPE reactor.

As above-mentioned, the features of the HVPE reactors provided by the present invention include:
 1. The reactor has a design of an input reagent gas flow and a reacted gas flow being oppositely directed and thermally coupled. The design makes the effect of the gas heating improved effectively and allows a reactor with a smaller volume. Besides, with the ability of quick responding to the changes of the temperature and the reagent gas flowing rate, the HVPE reactors are potentially suitable for the growth of quantum well structures.

2. With the design of an extended diffusion layer, the input reagent gas flow can be reacted with the substrate in a gas state during the diffusion process, so that it is possible to enhance the utilization efficiency of the reagents and obtain a good growth uniformity of the thin film.

3. The external bottom gas heater of the HVPE reactors according to the present invention allows the control of the temperature difference between the substrate and the internal side wall of the reactor, so that no deposition is formed on the internal side walls of the HVPE reactor.

4. The reaction chamber of the present invention is a cylindrical chamber with high symmetry, so that it is easy to control the model of the deposition processes.

Thus, the advantages of the HVPE reactors provided by the present invention can be summarized as follows:

1. Good deposition uniformity.
2. High efficiency of gas reagent utilization.
3. Compact design.
4. Easily controlling and modeling the deposition processes due to the high symmetry.
5. Possibility of using low power heater.
6. Possibility of growing a QW structure.
7. Possibility of suppressing the deposition on side walls of the reactor.

While the invention has been described in terms of what is presently considered to be the most practical and preferred embodiment, it is to be understood that the invention needs not be limited to the disclosed embodiment. On the contrary, it is intended, to cover various modifications and similar arrangements included within the spirit and scope of the appended claims which are to be accorded with the broadest interpretation so as to encompass all such modifications and similar structures.

What is claimed is:

1. A reactor for depositing a thin film on a substrate through a reaction between an input gas and said substrate, wherein a reacted gas is produced after said reaction, comprising:
   a vertical tube;
   a reaction chamber located inside said vertical tube, wherein said substrate is located at a bottom of said reaction chamber;
   a plurality of baffles staggeredly arranged along an inside wall of said vertical tube;
   a plurality of heaters connected to side walls of said vertical tube for controlling a temperature difference between said substrate and walls of said reactor and improving a distribution of said input gas; and
   a gas exit installed on said reaction chamber for exhausting said reacted gas; wherein an extended diffusion layer is formed from a bottom of said reaction chamber to said gas exit.

2. The reactor as claimed in claim 1, wherein said reactor is a hydride vapor deposition reactor.

3. The reactor as claimed in claim 1, wherein said gas exit is installed on a side wall of said reaction chamber.

4. The reactor as claimed in claim 1, wherein said reactor is made of a material selected from a group consisting of steel, quartz, sapphire, and ceramics.

5. The reactor as claimed in claim 1, wherein said input gas is a mixture of HCl, GaCl, $NH_3$, and Ar gases.

6. The reactor as claimed in claim 1, wherein said substrate is a sapphire substrate.

7. The reactor as claimed in claim 1, wherein said thin film is one compound selected from a group consisting of IV group and their alloys, III–V groups and their alloys, and GaN.

8. The reactor as claimed in claim 1, wherein said reacted gas is a mixture of HCl, GaCl, $Cl_2$, $NH_3$, and $H_2$ gases.

9. The reactor as claimed in claim 1, wherein further said extended diffusion layer is used for increasing a utility rate of said input gas and a deposition unity.

10. The reactor as claimed in claim 1, wherein said plurality of heaters comprise a first gas heater and a second gas heater.

11. The reactor as claimed in claim 10, wherein said first gas heater is one of an external side wall gas heater and an internal side wall gas heater.

12. The reactor as claimed in claim 10, wherein said second gas heater is an external bottom gas heater.

13. The reactor as claimed in claim 10, wherein said second gas heater comprises an input gas tube and a heater.

14. The reactor as claimed in claim 1, wherein said reaction chamber is a cylindrical chamber.

15. The reactor as claimed in claim 1, wherein said extended diffusion layer is used for transmitting said input gas to said substrate.

16. A hydride vapor deposition reactor for depositing a thin film on a substrate through a reaction between an input gas and said substrate, wherein a reacted gas is produced after said reaction, comprising:
   a vertical tube with two side wall gas heaters and a bottom gas heater;
   first baffles staggeredly located on an inside wall of said vertical tube for extending routes of a first gas and said reacted gas;
   a reaction chamber located inside said vertical tube;
   a second baffle located on a top of said reaction chamber;
   a Ga tank located in said vertical tube and connected to a second gas;
      wherein said first gas and second gas are mixed to form said input gas before passing through said second baffle; and
   a gas exit installed on a side wall of said reaction chamber for exhausting said reacted gas.

17. The hydride vapor deposition reactor as claimed in claim 16, wherein said thin film is one compound selected from a group consisting of III–V groups and their alloys, IV groups and their alloys, and GaN.

18. The hydride vapor deposition reactor as claimed in claim 16, wherein said two side wall gas heaters are a first gas heater and a second gas heater respectively located on external side walls of said vertical tube.

* * * * *